United States Patent
Kozawa et al.

(10) Patent No.: US 8,652,751 B2
(45) Date of Patent: Feb. 18, 2014

(54) RESIST COMPOSITION, METHOD FOR FORMING RESIST PATTERN, AND METHOD FOR PRODUCING ELECTRONIC DEVICE

(75) Inventors: Miwa Kozawa, Kawasaki (JP); Koji Nozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 537 days.

(21) Appl. No.: 12/557,211

(22) Filed: Sep. 10, 2009

(65) Prior Publication Data

US 2010/0047711 A1    Feb. 25, 2010

Related U.S. Application Data

(63) Continuation of application No. PCT/JP2007/069052, filed on Sep. 28, 2007.

(30) Foreign Application Priority Data

Mar. 14, 2007    (WO) .................. PCT/JP2007/055145

(51) Int. Cl.
  G03F 7/038    (2006.01)
  G03F 7/039    (2006.01)
  G03F 7/075    (2006.01)
  G03F 7/20     (2006.01)
  G03F 7/30     (2006.01)

(52) U.S. Cl.
  USPC ........ 430/270.1; 430/325; 430/326; 430/311; 430/313; 430/317; 430/905; 430/907

(58) Field of Classification Search
  None
  See application file for complete search history.

(56) References Cited

U.S. PATENT DOCUMENTS

| | | | |
|---|---|---|---|
| 6,210,856 B1 | 4/2001 | Lin et al. | |
| 6,270,941 B1 | 8/2001 | Yasunami | |
| 7,297,461 B2 | 11/2007 | Nishimura et al. | |
| 8,198,014 B2 * | 6/2012 | Kozawa et al. | 430/311 |
| 2002/0120058 A1 * | 8/2002 | Kozawa et al. | 524/588 |
| 2005/0171226 A1 | 8/2005 | Nishimura et al. | |
| 2005/0242440 A1 * | 11/2005 | Owada et al. | 257/758 |
| 2006/0078823 A1 | 4/2006 | Kanda et al. | |
| 2006/0222866 A1 | 10/2006 | Nakamura et al. | |
| 2006/0246373 A1 | 11/2006 | Wang | |
| 2007/0026689 A1 | 2/2007 | Nakata et al. | |
| 2007/0065753 A1 | 3/2007 | Mizutani et al. | |
| 2009/0053646 A1 | 2/2009 | Ishiduka et al. | |
| 2009/0068586 A1 | 3/2009 | Nakamura et al. | |

FOREIGN PATENT DOCUMENTS

| | | |
|---|---|---|
| JP | 2000-221685 A | 8/2000 |
| JP | 2000-221686 A | 8/2000 |
| JP | 2005-134456 A | 5/2005 |
| JP | 2005-221714 A | 8/2005 |
| JP | 2005-234326 A | 9/2005 |
| JP | 2006-133712 A | 5/2006 |
| JP | 2006-301524 A | 11/2006 |
| JP | 2006-309245 A | 11/2006 |
| JP | 2007-016177 A | 1/2007 |
| JP | 2007-086528 A | 4/2007 |
| WO | 2004/076535 A1 | 9/2004 |

OTHER PUBLICATIONS

International Search Report for PCT/JP2007/069052, mailing date of Oct. 30, 2007.

* cited by examiner

*Primary Examiner* — Sin J. Lee

(74) *Attorney, Agent, or Firm* — Westerman, Hattori, Daniels & Adrian, LLP

(57) ABSTRACT

A resist composition, which contains: a silicon compound having at least an alkyl-soluble group which may be substituted with a substituent; and a resin having an alkali-soluble group which may be substituted with an acid labile group, wherein the resist composition is designed to be subjected to immersion lithography.

13 Claims, 5 Drawing Sheets

Scanning motion

RESIST COMPOSITION, METHOD FOR FORMING RESIST PATTERN, AND METHOD FOR PRODUCING ELECTRONIC DEVICE

CROSS-REFERENCE TO RELATED APPLICATIONS

This application is based upon and claims the benefit of priority of the prior International Application No. PCT/JP2007/055145, filed on Mar. 14, 2007, the entire contents of which are incorporated herein by reference. This is a continuation application of PCT/JP2007/069052, filed on Sep. 28, 2007.

FIELD

The embodiments discussed herein are related to a resist composition for use in formation of a resist pattern in the process of production of an electronic device using the technology of immersion lithography and are also related to a method for forming a resist pattern using the resist composition, and a method for producing an electronic device using the resist composition.

BACKGROUND

As recent trends in the art, a semiconductor integrated circuit has been more and more highly integrated, and along with higher integration, the minimum pattern size reaches to the region of 100 nm or less. For the formation of fine patterns, lithography in which a resist material is exposed to ultraviolet light, has been conventionally used, and currently immersion lithography has attracted attentions as a new technology using ArF (fluorinated argon) excimer laser (wavelength of 193 nm), which has been developed for practical use, following the lithography.

In the immersion lithography a space between a projection lens of a stepper and a processing surface (wafer etc.) is filled with a medium having a larger refractive index than that of air, and as a result resolution is improved. In recent years, the techniques and materials, especially exposure devices and mediums (immersion mediums), for the immersion lithography have been developed.

However, there are problems typical for the immersion lithography such that various contaminations are eluted from a resist film to the immersion medium, as the resist film is exposed to the immersion medium (generally water) that fills the space between the projection lens and the processing surface. As a result of this, an optical element or inside of the exposure device is polluted, causing lower resolution due to exposure failure, or operational errors of the device.

To solve this problem, the method for forming a resist cover film on the top surface of the resist film has been considered. However, as the ArF excimer laser having a wavelength of 193 nm or $F_2$ excimer laser that has a shorter wavelength (157 nm) than that of the ArF excimer laser is not passed trough general organic materials, the range of the selection of the materials usable for the resist cover film is extremely narrow.

Currently a resist cover film using a fluororesin has been known (see Japanese Patent Application Laid-Open (JP-A) No. 2006-301524), but various problems have been found on the resist cover film, such as insufficient effect for suppressing the interaction to the exposure medium (resist film), or elution of contaminations from the resist cover film, and mixing with the resist film.

Moreover, even if a resist cover film which solves such problems is developed, a step for forming another film (a resist cover film) is still necessary after the formation of a resist film. Therefore, it is clear that the use of the resist cover film itself becomes demerit in terms of throughput.

Note that, in recent years, a method for improving an acryl resin itself for using a resist material has been considered. However, the changing the resin structure requires a large change in the ability of the resist material to form a fine pattern. Therefore, it may take a considerable time to realize such the resin.

Moreover, the technique in which silsesquioxane resin is used as a resist material, and the generation of organic gas (out gassing) from the resist film is suppressed so as to prevent pollution within an exposure device (see International Publication No. WO 2004/076535). However, the silsesquioxane resin disclosed in this patent literature always contains a fluorine atom, which is known as having a low refractive index. As the technique of immersion lithography aims at improving the resolution by achieving the high refractive index, it is necessary for the resist material for exclude a fluorine atom which may cause lowering of the refractive index.

Accordingly it is a current situation that a material which does not lower the throughput in the production process of a semiconductor, is capable of suppressing the generation of pollution to an optical element or within an exposure device by suppressing the elution to an immersion medium, does not lose original function for a resist, and suitably used for a resist film which can be highly accurately exposed by immersion lithography and associated techniques thereof have not been developed, and it has been desired in the art to develop such techniques.

SUMMARY

As a result of the researches and studies conducted by the inventors in view of the aforementioned object, the inventors have found the following findings. Namely at the time an electronic device is produced using the technique of immersion lithography use of a composition containing at least a silicon compound having a substituted or unsubstituted alkali-soluble group and resin having an alkali-soluble group or an alkali-soluble group substituted with an acid labile group, as a resist material for forming a resist pattern, suppresses the influences of elution or penetration caused between the resist composition and the immersion medium that is filled between a projection lens and a wafer, does not impair inherit characteristic of a resist, and is capable of forming a resist pattern of high resolution at high sensitivity. Moreover, by using this resist composition, a resist pattern is formed by immersion lithography with the same through put as in the processes of the conventional lithography and an electronic device is produced. Based upon the findings mentioned above, the invention has been completed.

The present invention is established based on the insights of the inventors, and means for solving the aforementioned problems are as follows.

According to an aspect of the invention, a resist composition contains: a silicon compound having at least an alkyl-soluble group which may be substituted with a substituent; and a resin having an alkali-soluble group which may be substituted with an acid labile group, wherein the resist composition is designed to be subjected to immersion lithography.

According to another aspect of the invention, a method for forming a resist pattern contains: forming a resist film on a processing surface using the resist composition of the invention; irradiating the resist film with exposure light in accordance with immersion lithography; and developing the exposed resist film so as to form a resist pattern.

According to another aspect of the invention, a method for producing an electronic device, contains: forming a resist film on a processing surface using the resist composition of the invention; irradiating the resist film with exposure light in accordance with immersion lithography; developing the exposed resist film so as to form a resist pattern; and etching the surface using the resist pattern as a mask.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS (Resist Composition)

Figure 1:
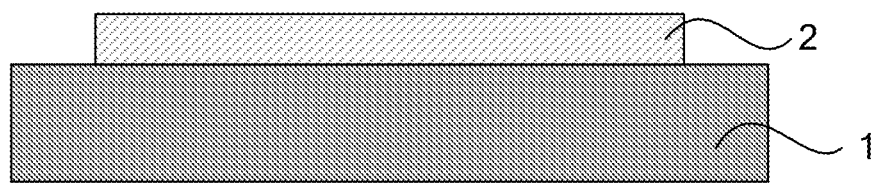
FIG. 1 is a schematic diagram for explaining an example of the method for forming a resist pattern of the present invention, and illustrates the condition where the resist film is formed.

The resist composition is used for a resist pattern which is formed by the technology of immersion lithography in the process of producing an electronic device.

The resist composition contains at least a silicon compound having at least an alkali-soluble group which may be substituted with a substituent, and a resin having an alkali-soluble group which may be substituted with an acid labile group, preferably further contains an acid generator, and more preferably further contains a resist solvent that is a solvent containing at least propylene glycol methyl ether acetate. The resist composition further contain appropriately selected other components, as necessary.

—Silicon Compound—

The silicon compound is not particularly limited and may be appropriately selected depending on the purpose as long as the silicon compound has at least an alkali-soluble group. As the silicon constitutes a main skeleton of the resist composition, the resist composition has lower absorbency to ArF excimer laser having a wavelength of 193 nm or $F_2$ excimer laser having a wavelength of 157 nm compared to that of the conventional organic materials, and as a result these rays of laser are transmitted through the resist film to form a resist pattern. Moreover, the silicon compound is a compound which originally has a high hydrophobicity and allows extremely small penetration of water compared to the conventional organic materials. In addition, the silicon compound containing the alkali-soluble group or alkali-soluble group that is substituted with a substituent has large compatibility to a resist developer that is a strong alkali, but has low solubility or penetration to water. Therefore, elution of acid or like from the resist film to the immersion medium (e.g. water), or a side reaction due to the penetration of the immersion medium to the resist film can be prevented.

The alkali-soluble group is not particularly limited, and appropriately selected depending on the intended purpose. Examples of the alkali-soluble group include a carboxylic acid-containing group, a sulfonic acid-containing group, a phenol-containing group, a hexafluorocarbinol-containing group, a silane group, and a silanol group. Among them, the carboxylic acid-containing group is preferable as it is identical to an alkali-soluble group contained in an acryl polymer used for a resist material corresponded to ArF excimer laser, is uniformly dissolved without pealing or remaining at the time of developing using an alkali developer, and is removable together with the resist film. Moreover, the alkali-soluble group containing silicon, that is the silane group, silanol group, or the like is preferable in terms of easiness of synthesis.

Note that, the groups containing the carboxylic acid-containing group, silan group, silanol group, and the like are not particularly limited as long as a carboxyl group, silane group or silanol group is contained in part of the structure, and appropriately selected depending on the intended purpose.

The alkali-soluble group may be substituted with a substituent.

The substituent is not particularly limited, and may be selected depending on the intended purpose. The substituent is preferably a functional group which detaches in the presence of acid. Such the substituent is not particularly limited and may be selected depending on the intended purpose, but preferable examples thereof include: those having alicyclic group such as adamantine and norbornane; tert-butyl group, tert-butoxycarbonyl group, tetrahydropyranyl group, and dimethyl benzyl group.

Examples of the functional group, which does not detach in the presence of acid, include alkyl group.

One of the preferred embodiments of the silicon compound having an alkali-soluble group which may be substituted with the substitutent is the silicon compound expressed by the following General Formula 1.

General Formula 1

Note that, in General Formula 1, $R^1$ is at least one selected from the group consisting of a monovalent organic group, a hydrogen atom and a hydroxyl group, $R^2$ is a monovalent organic group or a hydrogen atom, in which a plurality of the different groups and atom may be selected for each of $R^1$ and $R^2$ and at least one of $R^1$ and $R^2$ contains an alkali-soluble group which may be substituted; t is an integer of 1 to 3, each of a, b, and c represents a presence ratio, which is expressed by a≥0, b≥0, c≥0, but a, b and c are not to be 0 at the same time; and two or more different units may be present as $(R^1_t SiO_{(4-t)/2})_b$.

Namely General Formula 1 includes the case where two or more $(R^1_t SiO_{(4-t)/2})_b$ are present as in General Formula 2.

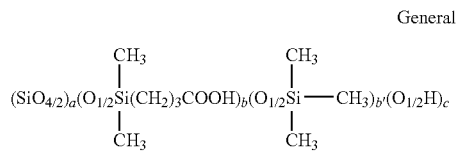
General Formula 2

Note that, in General Formula 2, each of a, b, b' and c represents a number for repeating, and a, b, b' and c are a>0, b>0, b'>0, and c≥0, respectively.

In General Formula 1, a monovalent organic group other than the alkali-soluble group which may be substituted with the substituent, which is expressed $R^1$ and $R^2$, is not particularly limited and may be appropriately selected depending on the intended purpose. Preferable examples of the monovalent organic group include C1-5 alkyl group, and trialkylsilyl group containing C1-5 alkyl group.

When the number of the carbon atoms thereof is more than five, the glass transition temperature (Tg) of the silicon compound becomes low, and a resist film may not be formed.

Moreover, as mentioned earlier, a plurality of different groups may be present as the monovalent organic group at the same time.

The weight average molecular weight of the silicon compound which may be substituted with the substituted is not particularly limited and may be appropriately selected depending on the intended purpose. For example, the weight average molecular weight thereof is preferably 1,000 to 1,000,000, more preferably 2,000 to 100,000 as measured by gel permeation chromatography using a polystyrene standard for calibration. Namely the silicon compound contained in the resist composition is a silicon polymer.

When the weight average molecular weight thereof is less than 1,000, the thermal resistance may be lowered. When the weight average molecular weight thereof is more than 1,000,000, the coating performance of the resist composition may be lowered.

The weight average molecular weight may be measured, for example, in accordance with gel permeation chromatography (GPC), which is one of the technologies of liquid chromatography and performs a separation based on the deference in the molecular sizes.

—Resin—

The resin is not particularly limited, and may be appropriately selected depending on the intended purpose, as long as the resin has an alkali-soluble group. As the preferred embodiment of the resin, those having an alicyclic structure within the resin, and acryl resin having an alicyclic structure are listed.

The alicyclic structure is positioned at least either a main chain of the resin or a side chain of the resin. Examples of the alicyclic structure include cyclohexane, cycloheptane, adamantine, norbornane, decalin, tricyclononane, tricyclodecane, tetracyclododecane, and derivatives thereof.

The resist composition may be of a positive type or a negative type. In the case where the resist composition is a positive resist composition, the resin contains the alkali-soluble group that is substituted with an acid labile group. In the case where the resist composition is a negative resist composition, the resin contains the alkali-soluble group which is not substituted with the acid labile group.

The alkali-soluble group is not particularly limited, and may be appropriately selected depending on the intended purpose. Examples of the alkali-soluble group include hydroxyl group, carboxyl group, and hexafluolocarbinol group.

The acid labile group is not particularly limited, and may be appropriately selected depending on the intended purpose. Examples of the acid labile group include: those having an alicyclic group such as adamantine, and norbornane; tert-butyl group; tert-butoxycarbonyl group; tetrahydropyranyl group; and dimethyl benzyl group.

The weight average molecular weight of the resin which may be substituted with the substituted is not particularly limited and may be appropriately selected depending on the intended purpose. For example, the weight average molecular weight thereof is preferably 1,000 to 1,000,000, more preferably 3,000 to 50,000 as measured by gel permeation chromatography using a polystyrene standard for calibration.

When the weight average molecular weight thereof is less than 1,000, the thermal resistance thereof may be lowered. When the weight average molecular weight thereof is more than 1,000,000, the coating performance of the resist composition may be lowered.

The weight average molecular weight may be measured, for example, in accordance with gel permeation chromatography (GPC), which is one of the technologies of liquid chromatography and performs a separation based on the deference in the molecular sizes.

—Acid Generator—

The acid generator is not particularly limited, and may be appropriately selected from those known in the art depending on the intended purpose. Examples of the acid generator include: onium salt such as diphenyl iodonium salt and triphenyl sulfonium salt; sulfonic acid ester such as benzyl tosylate and benzyl sulfonate; a halogenated organic compound such as dibromobisphenol A, and trisdibromopropyl isocyanurate. These may be used singly or in combination.

The amount of the acid generator contained in the resist composition is not particularly limited, and may be appropriately adjusted depending on the intended purpose. The amount of the acid generator is preferably 0.1% by mass to 20% by mass.

When the amount thereof is less than 0.1% by mass, the resist composition may not attain sufficient sensitivity as a chemically amplified resist. When the amount thereof is more than 20% by mass, the film formability or resolution may be lowered.

—Resist Solvent—

The resist solvent is not particularly limited, and may be appropriately selected depending on the intended purpose. The preferred embodiment is a solvent containing at least propylene glycol methyl ether acetate (PGMEA). The solvent containing PGMEA preferably further contains ethyl lactate (EL). It has been known in the conventional art that the occurrence of the striation is reduced, i.e. the coating properties are improved, when the resist composition is applied, by using two solvents in combination. For example, such the combination of the solvents is selected from propylene glycol monomethyl ether, γ-butyl lactone (GBL), ethyl lactate (EL) and the like. The combination of PGMEA and EL is advantageous, as the elution of the resist film to the immersion medium, which is the biggest problem in the immersion lithography is reduced as well as improving the coating properties of the resist composition.

Note that, in the case where PGMEA is used with either PGME or GBL in combination, the reduction effect in the elution of the resist film to the immersion medium may not be attained so easily. This is because the boiling point and water solubility of each of PGMEA, PGME and GBL provide influences.

The composition rate (PGMEA/EL) of propylene glycol methyl ether acetate (PGMEA) to ethyl lactate (EL) in the resist solvent is not particularly limited, and may be appropriately adjusted depending on the intended purpose. The composition rate (PGMEA/EL) is preferably 70/30 to 99/1, more preferably 85/15 to 95/5. When the ratio of the ethyl lactate (EL) is less than 1% by mass, the effect for reducing the elution of the resist film to the immersion medium may not be attained by the addition of the ethyl lactate. When the ratio of the ethyl lactate (EL) is more than 30% by mass, hydrophilic property of the resist film becomes too high and the immersion medium easily impregnate the resist film, resulted in impairing the effect for reducing the elution. The amount of the resist solvent contained in the resist composition is not particularly limited, and may be appropriately selected depending on the thickness of the resist film to be formed.

—Other Components—

Other components are not particularly limited as long as they do not adversely affect the effects obtainable by the invention, and may be appropriately selected depending on the intended purpose. As other components, various additives known in the art are listed. For example, a surfactant may be added for the purpose of improving the coating properties, and an amine additive may be added for the purpose of improving the storage stability.

The amount of the aforementioned other components contained in the resist composition may be appropriately determined depending on the types or amounts of the silicon compound, the resin and the like.

The composition ratio of the silicon compound having an alkali-soluble group which may be substituted with the substituent (hereinafter, may be referred as "silicon compound") to the resin having an alkali-soluble group which may be substituted with the substituent (hereinafter, may be referred as "silicon compound") within the resist composition may be appropriately adjusted depending on the alkali solubility of the silicon compound.

In the case where the silicon compound has a unsubstituted alkali-soluble group, as the alkali solubility of the silicon compound, the dissolution rate thereof is preferably 10 nm/sec to 2,000 nm/sec, more preferably 10 nm/sec to 1,000 nm/sec with respect to a 2.38% by mass of tetramethyl ammonium hydroxide (TMAH) solution at 25° C. In this case, the composition ratio (the silicon compound/the resin) of the silicon compound to the resin in the resist composition is preferably 50/50 to 0.01/99.99, more preferably 40/60 to 0.05/99.95, yet more preferably 20/80 to 0.2/99.8. Note that, as the alkali solubility of the exposed portion of the resist composition containing the silicon compound and the resin, the dissolution rate thereof is preferably 100 nm/sec to 5,000 nm/sec, more preferably 300 nm/sec to 5,000 nm/sec. In the case where the silicon compound has an alkali-soluble group which is substituted with the substituent and the substituent is a functional group which detaches in the presence of acid, the alkali solubility of the silicon compound in which the functional group is detached therefrom by acid, and the composition ratio (the silicon compound/the resin) of the silicon compound to the resin in the resist composition are the same as in the case of the silicon compound having the unsubstituted alkali-soluble group.

Moreover, in the case where the silicon compound has the alkali-soluble group which is substituted with the substituent and the substituent is a functional group which does not detach in the presence of acid, the alkali solubility of the silicon compound is expressed as the dissolution rate of less than 10 nm/sec. In this case, the composition ratio (the silicon compound/the resin) of the silicon compound to the resin is preferably 5/95 to 0.01/99.99, more preferably 2/98 to 0.02/99.98 on the mass basis. When the composition ratio of the silicon compound to the resin is in the range mentioned above, the silicon compound is removed along with the dissolution of the resin, the exposed portion of the resist composition containing the silicon compound and the resin is dissolved within the range of the aforementioned dissolution rate, as alkali-solubility of the exposed portion, and thus a patterning of the resist film formed from the resist composition is possible without impairing the resolution. This is a characteristic realized due to the substituent which is a functional group that does not detach in the presence of acid but is a substituent contained in the alkali-soluble group. Namely the silicon compound having the alkali-soluble group which is substituted with the substituent has slight hydrophilic property due to the polar group thereof. Especially as the wettability of the TMAH solution serving as an alkali developer is largely influenced by the presence of a slight polar group, the presence of the polar group plays, even though it is substituted, an important role in the structure of the silicon compound.

The transmittance of the silicon compound contained in the resist composition is not particularly limited with respect to the exposure light, and may be appropriately selected depending on the intended purpose. For example, when it is determined at the thickness of 100 nm, the transmittance of the silicon compound is preferably 30% or more, more preferably 50% or more, yet more preferably 80% or more with respect to ArF excimer laser (193 nm) and $F_2$ excimer laser (157 nm).

When a resist film in the thickness of 100 nm is formed with the resist composition, the transmittance of the resist composition is preferably 30% or more, more preferably 50% or more, yet more preferably 70% or more with respect to ArF excimer laser (193 nm), and is preferably 30% or more, more preferably 50% or more, yet more preferably 60% or more with respect to $F_2$ excimer laser (157 nm).

When the transmittance of the resist composition is less than 30%, highly precise exposure may not be performed on the resist film, and fine, highly precise resist pattern may not be attained. Note that, as higher transmittance of the resist composition is more preferably the upper limit thereof is 100%.

The resist composition suppresses the elution thereof to the immersion medium in the immersion lithography maintains the properties thereof without lowing, is capable of forming fine resist patterns, and is suitably used for the formation of a resist pattern, which is mentioned below.

The resist film formed with the resist composition prevents elution or penetration caused between an immersion medium, which fills the space between the resist film and a projection lens, and the resist film, and maintains original resist performance without adversely affecting the transmittance to ArF excimer laser.

(Method for Forming Resist Pattern)

The method for forming a resist pattern contains forming a resist film on a processing surface using a resist composition, irradiating the resist film with exposure light in accordance with immersion lithography and developing the exposed resist film so as to form a resist pattern, and may further contains other steps which is appropriately selected depending on the purpose.

<Resist Film Forming Step>

The resist film forming step is forming a resist film on a processing surface using the resist composition.

Note that, the details of the resist composition are as described earlier.

The processing surface is not particularly limited and appropriately selected depending on the intended purpose. Examples thereof include a surface layer of an arbitral member which is subject to form a fine pattern in accordance with photolithography. Preferable examples thereof include a substrate such as a silicon wafer and/or a surface thereof, and an insulating film such as various oxidized films and/or surface thereof.

The resist film is formed in accordance with any method known in the art, and for example, can be formed by a coating method.

The coating method is not particularly limited, and may be appropriately selected depending on the intended purpose. As an example of the coating method, a spin coating may be listed. In the case of the spin coating, as the conditions thereof, for example, the rotation number is approximately in the range of 100 rpm to 10,000 rpm, preferably 800 rpm to 5,000 rpm, and the duration for the coating is approximately in the range of one second to 10 minutes, preferably one second to 90 seconds.

The thickness of the coating is not particularly limited and may be appropriately adjusted depending on the intended purpose. For example, it is preferably 50 nm to 500 nm, more preferably 80 nm to 300 nm.

When the thickness thereof is less than 50 nm, defects such as pin holes may be caused. When the thickness thereof is more than 500 nm, the transmittance against ArF excimer laser or $F_2$ excimer laser is lowered, and thus resolution or exposure sensitivity may be lowered.

It is preferable that the coated resist composition is baked (heating and drying) at the time of or after the coating. The conditions and method of baking are not particularly limited and are appropriately selected depending on the intended purpose. For example, the temperature for baking is preferably 40° C. to 150° C., more preferably 80° C. to 120° C., and the duration for baking is preferably 10 seconds to 5 minutes, more preferably 30 seconds to 120 seconds.

In accordance with the step mentioned above, the resist film is formed on the processing surface.

<Immersion Exposure Step>

The immersion exposure step is irradiating the resist film with exposure light in accordance with immersion lithography.

The immersion lithography can be performed by the conventional immersion exposure device. The irradiation of the exposure light is performed on part of the region of the resist film. As a result, a polarity of such part of the region is changed, and the exposed region is removed in case of the positive resist composition or the unexposed region is removed in case of the negative resist composition in the developing step mentioned later to thereby form a resist pattern.

The immersion medium used for the immersion lithography and filling the space between the projection lens of the exposure device and the wafer is not particularly limited, and is appropriately selected depending on the intended purpose. The immersion medium is preferably a liquid having higher refractive index than the refractive index of air (refractive index=1) for the purpose of obtaining high resolution.

The liquid having the refractive index larger (higher) than 1 is not particularly limited and is appropriately selected depending on the intended purpose. The higher refractive index is more preferable. Preferable examples thereof include pure water, oil, glycerin, and alcohol. Among them, pure water (refractive index=1.44) is preferable.

The exposure light is not particularly limited and is appropriately selected depending on the intended purpose. The exposure light is preferably light having a short wavelength. ArF excimer laser (193 nm) and $F_2$ excimer laser (157 nm) are preferably as highly fine patterns can be attained.

<Developing Step>

The developing step is developing the resist film which has been exposed in the immersion exposure step.

In the developing step, the exposed region is removed in case of the positive resist composition, and the unexposed region is removed in case of the negative resist composition.

The method for removing the exposed region or the unexposed region is not particularly limited and is appropriately selected depending on the intended purpose. For example, the method is a method for removing using a developer.

The developer is not particularly limited and is appropriately selected depending on the intended purpose. The developer is preferably an alkali developer, for example, 2.38% by mass tetramethyl ammonium hydroxide (TMAH) solution.

In accordance with the step mentioned above, the exposed or unexposed region of the resist film is dissolved and removed to thereby form (develop) a resist pattern.

Hereinafter, an embodiment of the method for forming a resist pattern of the invention will be explained with reference to drawings.

As illustrated in FIG. 1, after coating a processing surface (substrate) 1 with the resist composition, the coated resist composition is baked (heating and drying) to thereby form a resist 2. Then, the resist film 2 formed on the processing surface 1 is exposed by an immersion exposure device 5 illustrated in FIG. 2.

Figure 2:
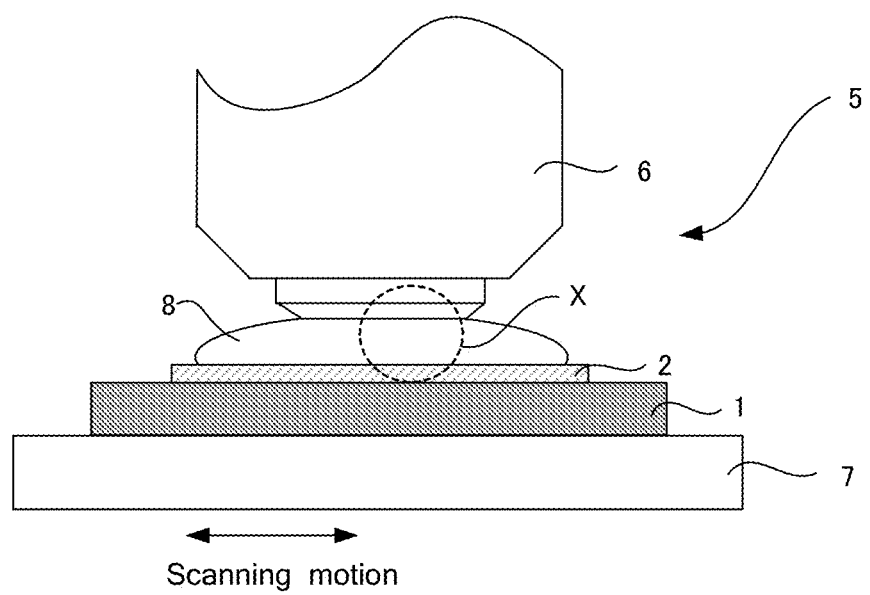
FIG. 2 is a schematic diagram for explaining an example of the method for forming a resist pattern of the present invention, and illustrates an example of an immersion exposure device.

FIG. 2 is a schematic diagram explaining one example of an immersion exposure device. The immersion exposure device 5 is equipped with a stepper (a successively moving exposure device) having a projection lens 6, and a wafer stage 7. The wafer stage 7 is disposed in the manner such that the processing surface 1 can be mounted thereon, and the space between the projection lens 6 and the processing surface 1 mounted on the wafer stage 7 is filled with an immersion medium 8. The resolution of the stepper is expressed by the following formula 1 of Rayleigh. As the wavelength of the light source is longer and the NA (brightness of the projection lens 6 N.A. (number of aperture)) of the projection lens 6 is lager, higher resolution can be obtained.

Resolution=$k$(proportional constant)×λ(wavelength of light emitted from a light source)/NA(number of aperture)  Formula 1

Figure 3:
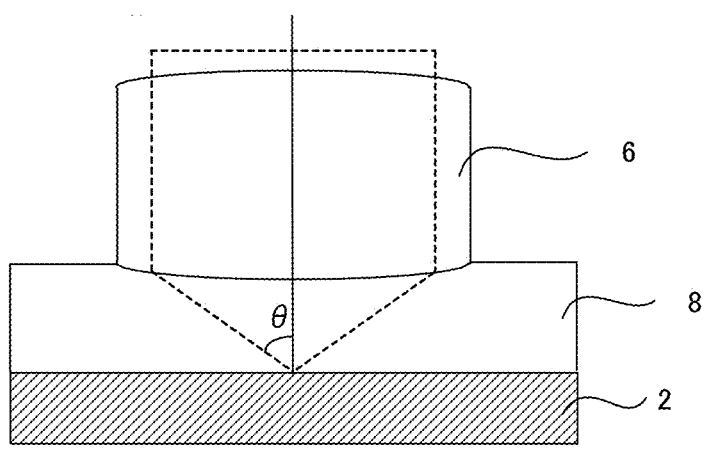
FIG. 3 is a partially enlarged view of the immersion exposure device of FIG. 2.

An enlarged view of X portion of FIG. 2 is illustrated in FIG. 3. As illustrated in FIG. 3, n represents refractive index of the immersion medium 8 though which exposure light is transmitted, and θ represents an angle the exposure light forms. Note that, in FIG. 3, the exposure light is represented by a dashed line, and is ArF excimer laser. In the conventional exposure method, a medium through which the exposure light is transmitted is air whose refractive index is n=1. The number of aperture NA of the projection lens (reduction projection lens) 6 is theoretically less than 1.0 at most, and approximately 0.9 (θ=65°) in actual conditions. In the case of the immersion exposure device 5, the liquid having the refractive index n larger than 1 is used as the immersion medium 8, which leads increase in the value of n. At the incident angle θ of the identical exposure light, the minimum size of resolution can be reduced to 1/n, and with the same number of aperture NA θ can be decreased, which leads increase of the depth of focus by n times. For example, when pure water is used as the immersion medium 8 and the light source is ArF excimer laser, n=1.44, and NA can be increased up to 1.44 times. Therefore, finer patterns can be formed.

Figure 4:
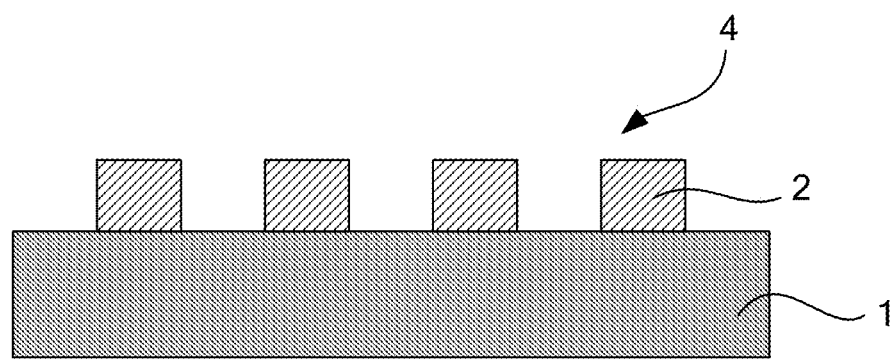
FIG. 4 is a schematic diagram for explaining an example of the method for forming a resist pattern of the present invention, and illustrates the condition where the resist film is developed after the immersion lithography.

The processing surface (substrate) 1 is mounted on the wafer stage 7 of such immersion exposure device 5, and the resist film 2 is exposed to the exposure light (e.g. ArF excimer laser) in a patterned form. Thereafter, the exposed resist film 2 is subjected to alkali developing, and as a result the region of the resist film 2 where is exposed to ArF excimer laser is dissolved and removed as illustrated in FIG. 4, to thereby form (develop) a resist pattern 4 on the processing surface (substrate) 1.

Note that, those mentioned above is the embodiment of the method for forming a resist pattern in which the positive resist composition corresponded to ArF excimer laser is used, but the combination of the exposure light and the resist composition is not limited to this embodiment, and may be appropriately selected depending on the intended purpose.

In the method for forming a resist pattern, after forming a resist film on the processing surface using the resist composition, irradiating the resist film to exposure light in accordance with immersion lithography. Here, as the resist film is formed of the resist composition, elution or penetration caused between the resist film and the immersion medium which fills the space between a projection lens and a wafer can be suppressed, and a patterning can be performed without lowering the original performance of the resist. Moreover, as the silicon compound does not have an aromatic structure or carbon double bond which absorb ArF excimer laser, the resist composition has high transmittance of ArF excimer laser as well as the conventional resist material for ArF excimer laser, and exposure is performed highly precisely. Thereafter, the resist film is developed. At the time of developing, the resist film formed of the resist composition can be developed with the conventional developer in the conventional manner. As a result, a resist pattern is formed simply and efficiently. The resist pattern obtained in this manner is fine and precise, since the exposure is precisely performed without damaging the functions of the resist film.

According to the method for forming a resist pattern of the invention, the elution of the resist film to the immersion medium is suppressed, the functions of the resist film are maintained, the generation of pollution to an optical element and within an exposure device is suppressed, exposure is precisely performed in accordance with immersion lithography fine and precise resist patterns are simply and efficiently formed. Therefore, the method for forming a resist pattern is suitably applied for the productions of functional parts such as a mask pattern, reticle pattern, magnetic head, liquid crystal display (LCD), plasma display panel (PDP), and surface acoustic wave filter (SAW filter), optical parts used for connecting optical wirings, fine parts such as micro actuator, and an electronic device such as a semiconductor device, and is suitably used for the method for producing an electronic device of the invention, which will be mentioned below.

(Method for Producing Electronic Device)

The method for producing an electronic device of the invention contains at least a resist pattern forming step, and a patterning step, and may further contain appropriately selected other steps, if necessary.

<Resist Pattern Forming Step>

The resist pattern forming step is forming a resist film on a processing surface using the resist composition, irradiating the resist film with exposure light in accordance with immersion lithography and developing the exposed resist film so as to form a resist pattern. As a result of the resist pattern forming step, a resist pattern is formed on the processing surface.

Note that, the details of the resist pattern forming step is the same as in the method for forming a resist pattern of the invention, and the method of immersion lithography and resist pattern are as mentioned earlier.

Examples of the processing surface are surface layers of various members in an electronic device such as a semiconductor. Preferable examples thereof include a substrate such as a silicon wafer and/or a surface thereof, and a low dielectric constant film such as various oxidized films and/or a surface thereof.

The low dielectric constant film is not particularly limited and may be appropriately selected depending on the intended purpose, but is preferably an interlayer insulating film having dielectric constant of 2.7 or less. Examples of such interlayer insulating film include a porous silicon film, and a fluororesin film.

The porous silicon film may be formed, for example, by applying a material for forming a silicon film, heating so as to dry a solvent, and baking.

The fluororesin film is formed, for example, by using a mixed gas of $C_4F_8$ and $C_2H_2$ or $C_4F_8$ gas as a source in case of the formation of a fluorocarbon film, and accumulating the same by RFCVD (powder: 400 W).

In accordance with the step mentioned above, the resist film formed on the processing surface is irradiated with exposure light in accordance with immersion lithography and developed to thereby form a resist pattern.

<Patterning Step>

The patterning step is patterning the processing surface using the resist pattern as a mask (using a mask pattern) by etching.

The method of etching is not particularly limited and may be appropriately selected from the conventional methods depending on the intended purpose. For example, as the method of etching, dry etching is preferable. The conductions of the etching are not particularly limited and may be appropriately selected depending on the intended purpose.

In accordance with the step mentioned above, etching is performed using the resist pattern as a mask, and as a result the processing surface is patterned.

In the method for producing an electronic device, after forming a resist film on the processing surface using the resist composition, irradiating the resist film to exposure light in accordance with immersion lithography. Here, as the resist film is formed of the resist composition, elution or penetration caused between the resist film and the immersion medium which fills the space between a projection lens and a wafer can be suppressed, and a patterning can be performed without lowering the original performance of the resist. Moreover, as the silicon compound does not have an aromatic structure or carbon double bond which absorb ArF excimer laser, the resist composition has high transmittance of ArF excimer laser as well as the conventional resist material for ArF excimer laser, and exposure is performed highly precisely. Thereafter, the resist film is developed. At the time of developing, the resist film formed of the resist composition can be developed with the conventional developer in the conventional manner. As a result, a resist pattern is formed simply and efficiently. The resist pattern obtained in this manner is fine and precise, since the exposure is precisely performed without damaging the functions of the resist film.

Next, in the patterning step, etching is performed using the resist pattern formed in the resist pattern forming step. Therefore, the processing surface is patterned finely precisely and accurately in size, and an electronic device such as a semiconductor device, which has an extremely fine, highly precise, excellently accurately sized pattern such as a wiring pattern is efficiently produced. Moreover, a high performance electronic device having a fine wiring pattern formed using the resist pattern, e.g. an electronic device such as various semiconductor devices including flash memory DRAM, and FRAM, can be efficiently mass produced.

According to the method for producing an electronic device of the invention, the elution of the resist film to the immersion medium is suppressed, the functions of the resist film are maintained, the generation of pollution to an optical element and within an exposure device is suppressed, exposure is precisely performed in accordance with immersion lithography fine and precise resist patterns are simply and efficiently formed.

EXAMPLES

Hereinafter, the examples of the present invention will be explained, but these examples shall not be construed as to limit the scope of the present invention.

Example 1

Preparation of Resist Composition

Base resins a to c respectively represented by Structural Formulae 1 to 3, and silicon compounds 1 to 5 respectively represented by Structural Formulae 4 to 8 were mixed based on the formulation of Table 1, and 100 parts by mass of the resulted mixture was added with 3 parts by mass of triphenyl sulfonium nonafluorobutane sulfonate (manufactured by Midori Kagaku Co., Ltd.), expressed by Structural Formula 9, serving as an acid generator. With the resulted mixture and propylene glycol methyl ether acetate (PGMEA) as the solvent, resist compositions A to Q for immersion lithography were prepared.

Base Resin a (weight average molecular weight (Mw)=7,100)

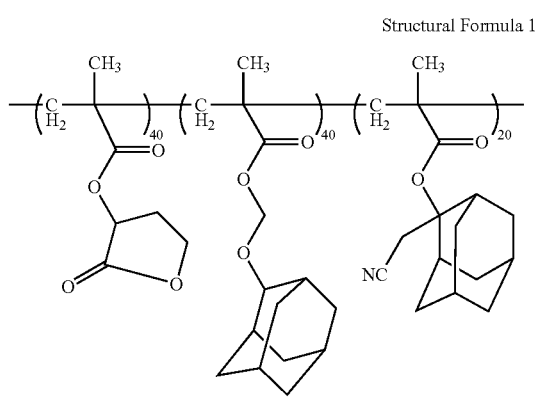

Structural Formula 1

Base Resin b (weight average molecular weight (Mw)=9,600)

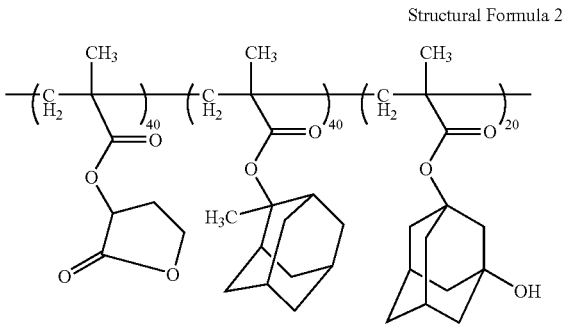

Structural Formula 2

Base Resin c (weight average molecular weight (Mw)=15,600)

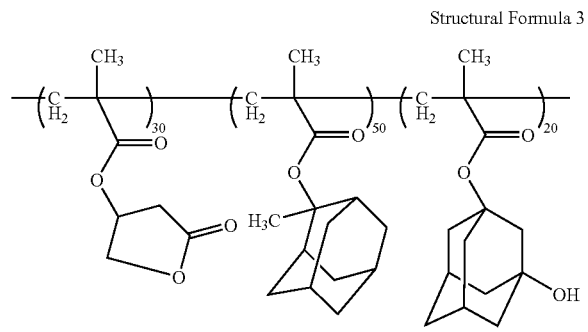

Structural Formula 3

Silicon Compound 1 (a silicon compound having an alkali-soluble group which may be substituted with an acid labile group; weight average molecular weight (Mw)=4,100)

Structural Formula 4

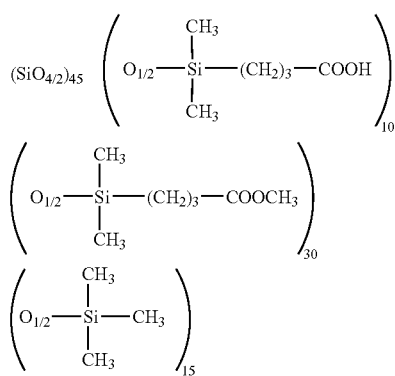

Silicon Compound 2 (a silicon compound having an alkali-soluble group (carboxylic acid containing group); weight average molecular weight (Mw)=3,400)

Structural Formula 15

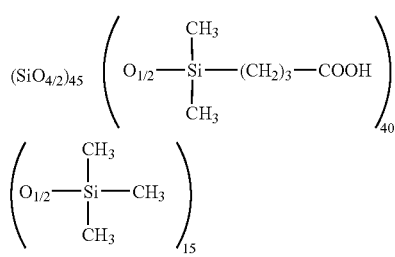

Silicon Compound 3 (a silicon compound having an alkali-soluble group which is substituted with an acid labile group; weight average molecular weight (Mw)=5,300)

Structural Formula 6

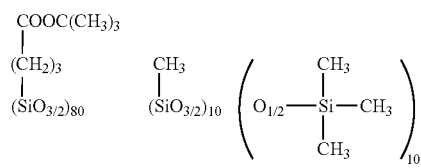

Silicon Compound 4 (a silicon compound having an alkali-soluble group (silanol group); weight average molecular weight (Mw)=4,600)

Structural Formula 7

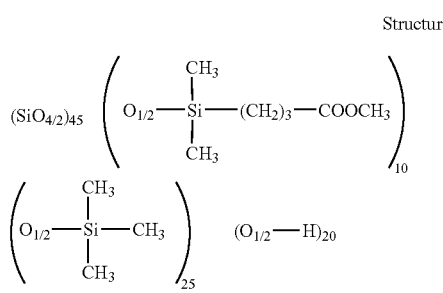

Silicon Compound 5 (a silicon compound having an alkali-soluble group (silan group); weight average molecular weight (Mw)=6,000)

Structural Formula 8

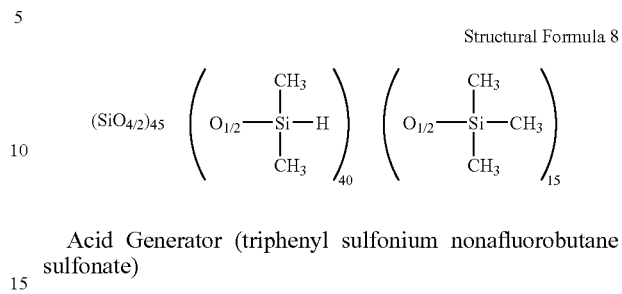

Acid Generator (triphenyl sulfonium nonafluorobutane sulfonate)

Structural Formula 9

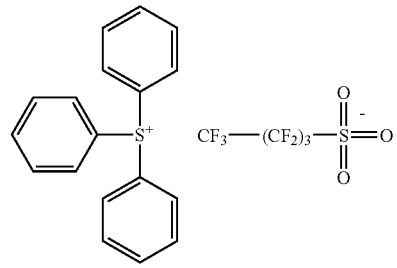

TABLE 1

| Resist Composition | Base Resin | Silicon Compound | Composition ratio (mass %) (Base Resin/Silicon Compound) |
|---|---|---|---|
| A | a | — | — |
| B | b | — | — |
| C | c | — | — |
| D | a | 1 | 99/1 |
| E | b | 1 | 99/1 |
| F | c | 1 | 99/1 |
| G | a | 2 | 99/1 |
| H | b | 2 | 99/1 |
| I | c | 2 | 99/1 |
| J | a | 3 | 99/1 |
| K | b | 3 | 99/1 |
| L | c | 3 | 99/1 |
| M | c | 4 | 99/1 |
| N | c | 5 | 99/1 |
| O | c | 2 | 99.8/0.2 |
| P | c | 2 | 99.5/0.5 |
| Q | c | 2 | 99/5 |

Note that, A-Q represented in Table 1 are corresponded to the resist compositions A to Q, respectively and within the resist compositions A to Q, the resist compositions A to C are comparative examples, and the resist compositions D to Q are examples (embodiments of the invention).

Example 2

Formation of Resist Pattern

Each of the resist compositions A to Q of Table 1 was spin coated on a silicon substrate on which an antireflection film (ARC-39, manufactured by Nissan Chemical Industries, Ltd.) had been formed by spin coating at 2,000 rpm for 25 seconds, and the coated film was baked on a hot plate having a temperature of 110° C. for 60 seconds, to thereby form a resist film for immersion lithography having a thickness of 250 nm.

Next, water serving as an immersion medium was filled in the space between each resist film sample and an optical element, and the sample was exposed with ArF excimer laser (wavelength of 193 nm) as exposure light, by means of an immersion lithographic device. Here, the resist film sample using the resist composition D had the transmittance of 80%, and refractive index of 1.69 with respect to ArF excimer laser (wavelength of 193 nm). Note that, the measurement of the transmittance was when the resist film had a thickness of 100 nm.

Next, each resist film sample was developed with 2.38% by mass TMAH solution to thereby dissolve and remove the exposed portion of the resist film. As a result, with exposure doses respectively denoted in Table 2, a line-space pattern of 300 nm was defined. Here, the exposure portion of the resist film sample using the resist composition D had a dissolution rate of 900 nm/sec with respect to 2.38% by mass of TMAH solution.

TABLE 2

| Resist Composition | Exposure dose (mJ/cm$^2$) |
| --- | --- |
| A | 25 |
| B | 46 |
| C | 39 |
| D | 25 |
| E | 46 |
| F | 39 |
| G | 25 |
| H | 46 |
| I | 39 |
| J | 25 |
| K | 46 |
| L | 39 |
| M | 39 |
| N | 39 |
| O | 39 |
| P | 39 |
| Q | 39 |

From the results of Table 2, the resist compositions D to Q of the present embodiment could form a line-space pattern at the same sensitivity to the resist compositions A to C, even though the resist compositions D to Q contained the silicon compounds expressed by the structural formulae 4 to 8. It was found that the performance originated from the resist was not lowered without the change in the sensitivity due to the addition of the silicon compound.

Note that, in the case where the base resin which easily cause acid leaving, the exposure dose is reduced, and is highly sensitive compared to the case where the base resin which does not easily cause acid leaving.

Example 3

Elution Test of Contamination

Each of the resist compositions A to Q of Table 1 was spin coated on a 6-inch wafer substrate, on which an antireflection film (ARC-39, manufactured by Nissan Chemical Industries, Ltd.) had been formed by coating, at 2,000 rpm for 25 seconds by spin coating, and the coated film was baked on a hot plate having a temperature of 110° C. for 60 seconds to thereby form a resist film having a thickness of 250 nm. Each of the obtained resist films was exposed by a DUV lamp emitting light having a wavelength of 254 nm at the exposure dose of 50 mJ/cm$^2$ and at the same time to the exposure, the surface (area of 154 cm$^2$) of the wafer substrate was washed with 5 mL of pure water, to thereby obtain a sample solution.

5 μL of the thus obtained sample solution was analyzed by means of LC-MSD (1100 serious, manufactured by Agilent Technologies, Inc.), and as a result, it was confirmed that anion ($C_4F_9SO_3^-$) of the acid generator was eluted in the sample solution.

The amounts of anion of the acid generator eluted in the sample solutions corresponded to the resist compositions A to Q are presented in Table 3, respectively.

TABLE 3

| Resist Composition | Elution amount (ppb) |
| --- | --- |
| A | 95.8 |
| B | 72.3 |
| C | 60.5 |
| D | 50.3 |
| E | 61.2 |
| F | 41.3 |
| G | 54.8 |
| H | 60.8 |
| I | 44.3 |
| J | 55 |
| K | 59.9 |
| L | 42.1 |
| M | 46.2 |
| N | 40 |
| O | 59.1 |
| P | 53.5 |
| Q | 32.3 |

From the results of Table 3, it was found that each of the resist compositions D, G and J had lower elution amount of the contamination compared to the resist composition A (base resin a), which did not contain the silicon compound, and similarly each of the resist compositions E, H, and K had lower elution amount of the contamination compared to the resist composition B (base resin b), and furthermore each of the resist compositions F, I, L, and M to Q had lower elution amount of the contamination compared to the resist composition C (base resin c). Based on this finding, it is clear that the resist composition of the present embodiment, in which the silicon compound is added, is capable of suppressing the elution of the contamination, which is problematic at the time of immersion lithography from the resist film to the immersion medium.

Example 4

Evaluation Test for Hydrophobic Property

Each of the resist compositions A to Q of Table 1 was spin coated on a 6-inch wafer substrate, on which an antireflection film (ARC-39, manufactured by Nissan Chemical Industries, Ltd.) had been formed by coating, at 2,000 rpm for 25 seconds by spin coating, and the coated film was baked on a hot plate having a temperature of 110° C. for 60 seconds to thereby form a resist film having a thickness of 250 nm. Each of the prepared resist films was subjected to the measurements of a static contact angle and receding contact angle (dynamic contact angle) of water, using pure water and the results were compared.

The static contact angle was measured by means of a contact angle meter (CA-W 150, manufactured by Kyowa Interface Science Co., Ltd.) at the condition such that the ejection duration be 40 ms.

Moreover, the receding contact angle was measured by using the self-produced device by the inventors. The wafer substrate on which the resist film had been formed was fixed on a sloped stage, which was capable of continuously changing the angle thereof, and a droplet (50 μL) was dropped on a surface of the resist film. Soon after the droplet was dropped, the stage was inclined at a constant speed, the receding contact angle was measured on the shape of the droplet after a certain time from when the droplet had started moving. The results are presented in Table 4.

TABLE 4

| Resist Composition | Static Contact Angle (°) | Dynamic Contact Angle (°) |
| --- | --- | --- |
| A | 72.8 | 55.3 |
| B | 67.4 | 52.2 |
| C | 69.1 | 57.2 |
| D | 89.3 | 70.3 |
| E | 80.3 | 69.3 |
| F | 81.1 | 69.1 |
| G | 85.4 | 69 |
| H | 78.6 | 67.6 |
| I | 78.6 | 67.2 |
| J | 87.9 | 70 |
| K | 79.9 | 68.3 |
| L | 80.6 | 69.3 |
| M | 76.1 | 68.3 |
| N | 83.1 | 72.3 |
| O | 71.3 | 56.1 |
| P | 74.9 | 65.3 |
| Q | 90.8 | 79.4 |

From the results of Table 4, it was found that each of the resist compositions D to Q of the present embodiment, in which the silicon compound was added, had an improved contact angle compared to the resist compositions A to C, in which the silicon compound was not added, the resist compositions D to Q of the present embodiment had high hydrophobic properties.

Example 5

Preparation of Resist Composition

The resist compositions R to Z were prepared in the same manner as in Example 1, provided that the resist solvent of the formulation presented in Table 5 was used. Namely each of the base resins (acryl resin) a to c represented by Structural Formulae 1 to 3, respectively and each of the silicon compounds 1 to 5 represented by Structural Formulae 4 to 8 respectively of Example 1, were mixed so that the composition ratio of the silicon compound to the acryl resin became 1/99 (the silicon compound/acryl resin=1/99). To 100 parts by mass of the resulted mixture, 3 parts by mass of triphenyl sulfonium nonafluorobutane sulfonate represented by Structural Formula 9 (manufactured by Midori Kagaku Co., Ltd.) was added as an acid generator, and with the mixture and the resist solvent presented in Table 5, the resist compositions R to Z for immersion lithography were prepared.

TABLE 5

| Resist Composition | Base Resin | Silicon Compound | Resist Solvent | | Composition rate (mass %) (first/second) |
| --- | --- | --- | --- | --- | --- |
| | | | First Solvent | Second Solvent | |
| I | c | 2 | PGMEA | — | 100/0 |
| R | c | 2 | PGMEA | EL | 90/10 |
| S | c | 2 | PGMEA | GBL | 90/10 |
| T | c | 2 | PGMEA | PGME | 90/10 |
| U | c | 2 | PGMEA | EL | 96/4 |
| V | c | 2 | PGMEA | EL | 60/40 |
| W | a | 1 | PGMEA | EL | 90/10 |
| X | b | 3 | PGMEA | EL | 90/10 |
| Y | c | 4 | PGMEA | EL | 90/10 |
| Z | c | 5 | PGMEA | EL | 90/10 |

Note that, in Table 5, the resist composition I denotes the resist composition I of Example 1. Moreover, PGMEA, EL, GBL, and PGME denote propylene glycol methyl ether acetate, ethyl lactate, γ-butyl lactone, and propylene glycol monomethyl ether, respectively.

Example 6

Formation of Resist Pattern

The resist pattern was formed using the resist compositions R to Z prepared in Example 5, in the same manner as in Example 2. As a result, a line-space pattern of 300 nm was defined at the exposure dose presented in Table 6.

TABLE 6

| Resist Composition | Exposure dose (mJ/cm$^2$) |
| --- | --- |
| I | 39 |
| R | 39 |
| S | 39 |
| T | 39 |
| U | 39 |
| V | 39 |
| W | 25 |
| X | 46 |
| Y | 39 |
| Z | 39 |

From the results of Table 6, it was found that the resist compositions R to Z, each of which contained a combination of PGMEA (the first solvent), and any of EL, GBL and PGME (the second solvent), could form the line-space pattern at the same degree of the sensitivity to the resist composition I in which only PGMEA (the first solvent) was contained as the resist solvent, and did not lower the original performance of the resist without the change in the sensitivity due to the presence of the second solvent.

Example 7

Elution Test of Contamination

Using the resist compositions R to Z prepared in Example 5, the elution amount of anion of the acid generator was measured in the same manner as in Example 3. The results are presented in Table 7.

TABLE 7

| Resist Composition | Elution amount (ppb) |
|---|---|
| I | 44.3 |
| R | 33.9 |
| S | 58.6 |
| T | 48.8 |
| U | 35.1 |
| V | 50.2 |
| W | 43.2 |
| X | 51.9 |
| Y | 42.0 |
| Z | 31.9 |

From the results of Table 7, it was found that compared to the resist composition I in which only PGMEA (the first solvent) was used, the resist composition S, in which 10% by mass of GBL was added as the second solvent, and the resist composition T, in which 10% by mass of PGME was added as the second solvent, had increased elution amounts of the contamination, whereas the resist compositions R and U in which ethyl lactate was used as the second solvent had the decreased elution amounts of the contamination. Especially the resist composition R, in which 10% by mass of ethyl lactate was added, reduced the elution amount of the contamination by approximately 25% compared to that of the resist composition I.

However, it was also found that the resist composition V, in which a large amount of ethyl lactate, i.e. 40% by mass, was contained, increased the elution amount of the contamination.

Moreover, comparing the results of the resist compositions all of which had the same types of the base resin and silicon compound based on the presence of ethyl lactate (the second solvent), the resist compositions W, X, Y and Z, in which PGMEA and ethyl lactate were contained, had less elution amounts of the contamination than that of the resist compositions D, K, M and N in which only PGMEA was contained. Based on this result, it was found that the addition of ethyl lactate more effectively suppressed the elution of the contamination, which was problematic at the time of immersion lithography from the resist film to the immersion medium, regardless the types of the base resin and silicon compound.

Example 8

Evaluation Test of Hydrophobic Property

Using the resist compositions R to Z prepared in Example 5, the static contact angle and receding contact angle (dynamic contact angle) of water were measured and the results were compared. The results are presented in Table 8.

TABLE 8

| Resist Composition | Static Contact Angle (°) | Dynamic Contact Angle (°) |
|---|---|---|
| I | 78.6 | 67.2 |
| R | 78.4 | 66.9 |
| S | 79.8 | 69.1 |
| T | 78.2 | 67.0 |
| U | 78.4 | 67.6 |
| V | 72.1 | 62.3 |
| W | 87.9 | 70.0 |
| X | 79.0 | 67.9 |
| Y | 76.2 | 67.5 |
| Z | 82.9 | 72.0 |

From the results of Table 8, it was confirmed that any of the resist composition I, in which only PGMEA (the first solvent) was used, and the resist compositions R to Z, in which the first solvent and the second solvent selected from EL, GBL and PGME were used in combination, had the same degrees of the contact angle, and high hydrophilic properties, and moreover there was no significant fall in the contact angle with the addition of the second solvent.

Example 9

Production of Electronic Device (Semiconductor Device)

Figure 5:
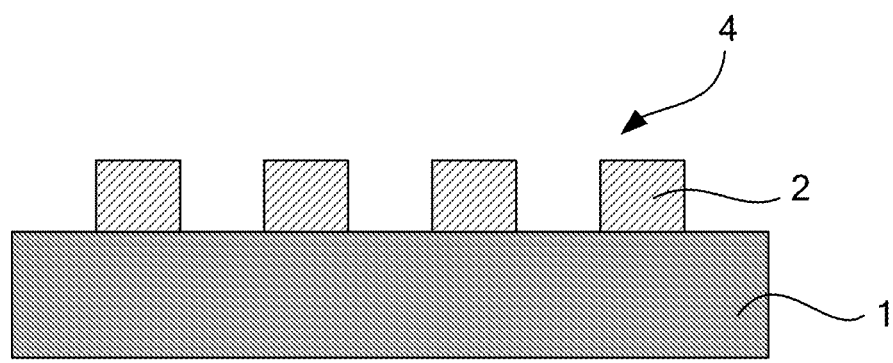
FIG. 5 is a schematic diagram for explaining an example of the method for producing an electronic device of the present invention, and illustrates the condition where an interlayer insulating film is formed on a silicon substrate.
Figure 6:
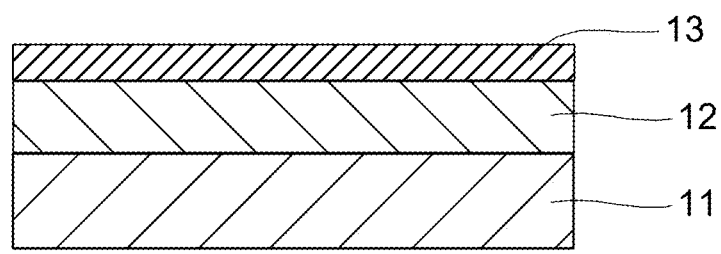
FIG. 6 is a schematic diagram for explaining an example of the method for producing an electronic device of the present invention, and illustrates the condition where a titanium film is formed on the interlayer insulating film of FIG. 5.
Figure 7:
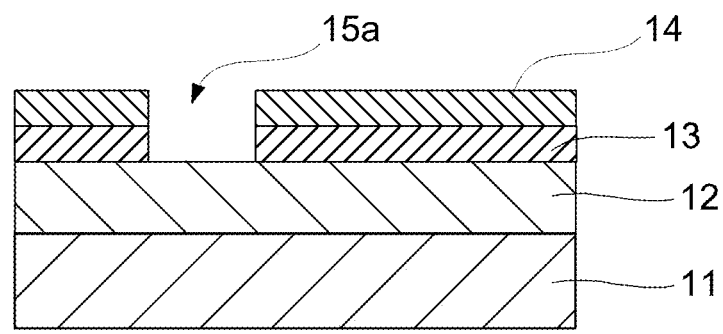
FIG. 7 is a schematic diagram for explaining an example of the method for producing an electronic device of the present invention, and illustrates the condition where a resist film is formed on the titanium film, and a hole pattern is formed in the titanium film.
Figure 8:
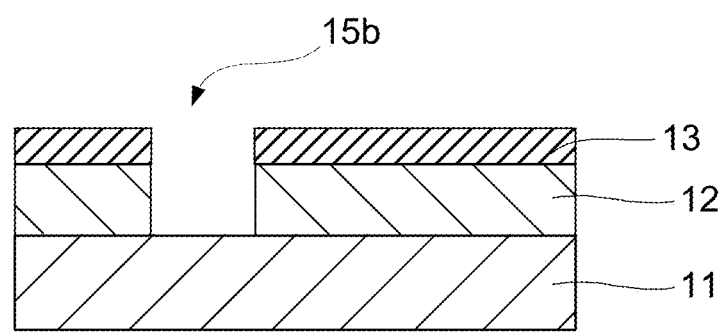
FIG. 8 is a schematic diagram for explaining an example of the method for producing an electronic device of the present invention, and illustrates the condition where a hole pattern is also formed in the interlayer insulating film.

As illustrated in FIG. 5, an interlayer insulating film 12 was formed on an silicon substrate 11, and a titanium film 13 was formed on the interlayer insulating film 12 by sputtering as illustrated in FIG. 6. Next, a resist pattern 14 was formed in accordance with the conventional technique of photolithography as illustrated in FIG. 7, and using the resist pattern as a mask, the titanium film 13 was patterned by reactive ion etching so as to form an opening 15a. Subsequentially as well as removing the resist pattern 14 by reactive ion etching, an opening 15b was formed in the interlayer insulating film 12 using the titanium film 13 as a mask as illustrated in FIG. 8.

Figure 9:
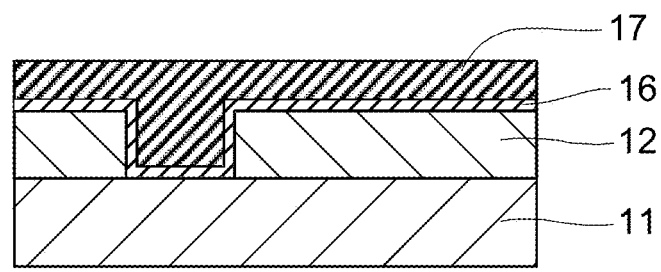
FIG. 9 is a schematic diagram for explaining an example of the method for producing an electronic device of the present invention, and illustrates the condition where a Cu film is formed on the interlayer insulating film in which the hole pattern has been formed.
Figure 10:
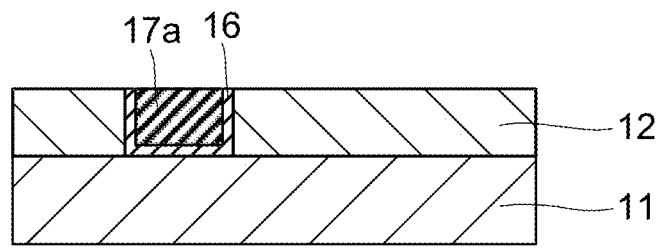
FIG. 10 is a schematic diagram for explaining an example of the method for producing an electronic device of the present invention, and illustrates the condition where Cu accumulated on the portion of the interlayer insulating film other than the hole pattern was removed.

Next, the titanium film 13 was removed by wet processing, and as illustrated in FIG. 9, a TiN film 16 was formed on the interlayer insulating film 12 by sputtering, followed by forming a Cu film 17 on the TiN film 16 by electroplating. Thereafter, as illustrated in FIG. 10, leaving the barrier metal and Cu film (the first metal film) only in the gap corresponding to the opening 15b (FIG. 8), the other portions of the barrier metal and Cu film were removed and flattened by CMP to thereby form a first layer wiring 17a.

Figure 11:
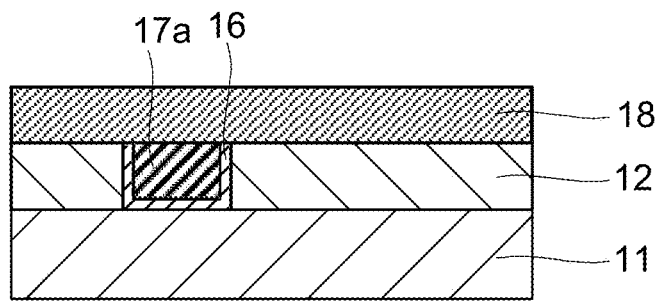
FIG. 11 is a schematic diagram for explaining an example of the method for producing an electronic device of the present invention, and illustrates the condition where an interlayer insulating film is formed on the Cu plug and the TiN film both of which are have been formed in the hole pattern.
Figure 12:
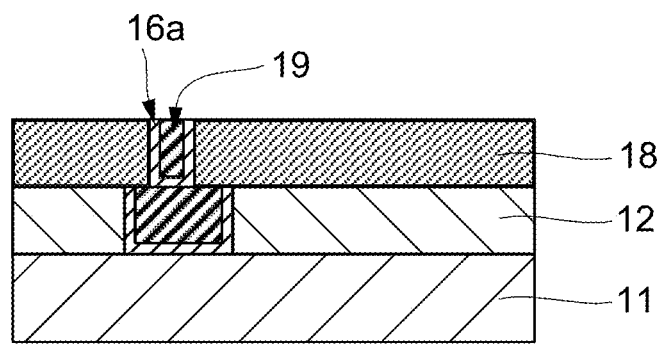
FIG. 12 is a schematic diagram for explaining an example of the method for producing an electronic device of the present invention, and illustrates the condition where a hole pattern is formed the interlayer insulating film serving as a surface layer, and then a Cu plug is formed therein.

Subsequentially as illustrated in FIG. 11, an interlayer insulting film 18 was formed on the first layer wiring 17a, and then similar to FIGS. 5 to 10, a Cu plug (the second metal film) 19 and TiN film 16a, which would connect between the first layer wiring 17a and the upper layer wiring formed later, was formed as illustrated in FIG. 12.

Figure 13:
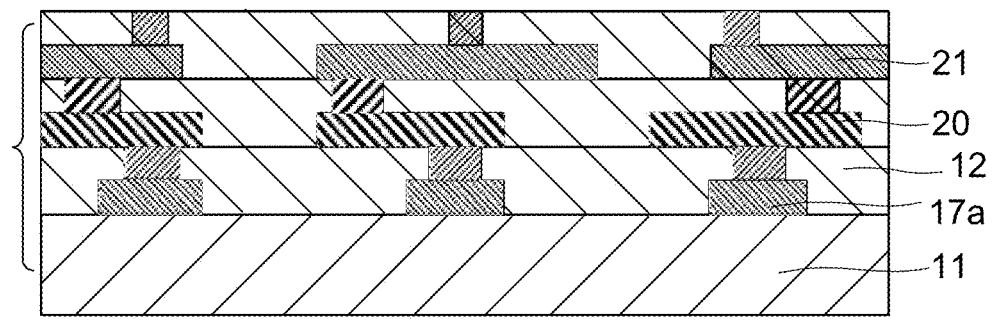
FIG. 13 is a schematic diagram for explaining an example of the method for producing an electronic device of the present invention, and illustrates the condition where a wiring of three layered structure is formed.

By repeating each of the aforementioned processes, a semiconductor device which had a multi-layered wiring structure containing the first layer wiring 17a, the second layer wiring 20 and the third layer wiring 21 on the silicon substrate 11, as illustrated in FIG. 13, was produced. Note that, in FIG. 13, the barrier metal layer formed as an underlying layer of each of wirings is not illustrated.

In Example 9, the resist pattern 14 was a resist pattern formed with the resist composition Z prepared in Example 5, in accordance with immersion lithography.

Moreover, the interlayer insulating film 12 was a low dielectric film having a dielectric constant of 2.7 or less, such as a porous silicon film (CERAMATE NCS, manufactured by JGC Catalysts and Chemicals Ltd., dielectric constant of 2.25) and fluorocarbon film (dielectric constant of 2.4) accumulated and formed by RFCVD (power: 400 W) using mixed gas of $C_4F_8$ and $C_2H_2$, or $C_4F_8$ gas as a source.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification related to a showing of the superiority and inferiority of the invention. Although the embodiments of the present invention have been described in detail, it should be understood that the various changes, substitutions, and alterations could be made hereto without departing from the spirit and scope of the invention.

As has been described above, the resist composition is suitable for use in immersion lithography has high transmittance against ArF excimer laser (193 nm), and is dissolved in 2.38% by mass TMAH solution that is a conventional resist developer.

Moreover, the resist composition is capable of forming a fine resist pattern while suppressing the elution of the contamination from the acid generator or the like of the resist film to the immersion medium, which is problematic at the time of immersion lithography and preventing the generating pollutions within the optical element and exposure device due to the elution of the contamination.

By using the resist composition of the invention, highly precise exposure can be performed in accordance with immersion lithography and a fine and highly precise resist pattern can be simply and efficiently formed. Therefore, it is effective for miniaturization of wiring and increasing the laminated layers, along with developments related to the high integration and high performance of an electronic device such as a semiconductor.

The resist composition of the invention suppresses elution to the immersion medium without lowing performance, and has high transmittance to ArF excimer laser, and thus is suitably used for a resist film for immersion lithography.

The method for forming a resist pattern of the invention is suitably applied for the productions of functional parts such as a mask pattern, reticle pattern, magnetic head, liquid crystal display (LCD), plasma display panel (PDP), and surface acoustic wave filter (SAW filter), optical parts used for connecting optical wirings, fine parts such as micro actuator, and an electronic device such as a semiconductor device, and is suitably used for the method for producing an electronic device of the invention The method for producing an electronic device of the invention is suitable for production of an electronic device such as various semiconductor devices including a flash memory DRAM, and FRAM.

What is claimed is:

1. A resist composition, comprising:
    a silicon compound; and
    a resin having an alkali-soluble group which may be substituted with an acid labile group,
    wherein the resist composition is designed to be subjected to immersion lithography, and
    wherein the silicon compound is expressed by Structural Formula 8:

Structural Formula 8

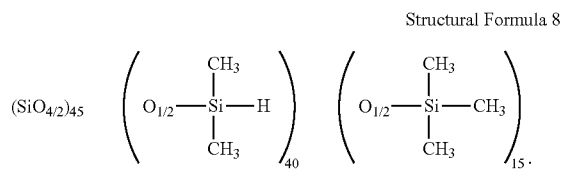

2. The resist composition according to claim 1, wherein the resin has an alicyclic structure.

3. The resist composition according to claim 1, wherein the alkali-soluble group in the resin contains at least one selected from the group consisting of a hydroxyl group, a carboxyl group and a hexafluorocarbinol group.

4. The resist composition according to claim 1, further comprising an acid generator.

5. The resist composition according to claim 1, further comprising a resist solvent which is a solvent containing at least propylene glycol methyl ether acetate.

6. The resist composition according to claim 5, wherein the solvent containing at least propylene glycol methyl, ether acetate further contains ethyl lactate.

7. The resist composition according to claim 6, wherein a composition ratio of the propylene glycol methyl ether acetate to the ethyl lactate is 70/30 to 99/1 on the mass percent basis.

8. The resist composition according to claim 1, wherein exposure light for use in the immersion lithography is ArF excimer laser having a wavelength of 193 nm or $F_2$ excimer laser having a wavelength, of 157 nm.

9. A method for forming a resist pattern, comprising:
    forming a resist film on a processing surface using a resist composition;
    irradiating the resist film with exposure light in accordance with immersion ithography; and
    developing the exposed resist film so as to form a resist pattern,
    wherein the resist composition comprises:
    a silicon compound; and
    a resin having an alkali-soluble group which may be substituted with an acid labile group, and
    wherein the silicon compound is expressed by Structural Formula 8:

Structural Formula 8

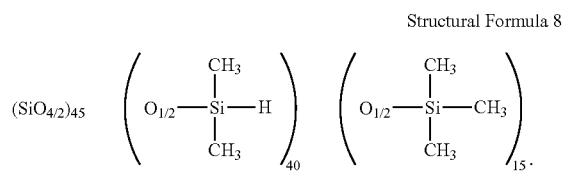

10. The method for forming a resist pattern according to claim 9, wherein the developing is performed with an alkali developer.

11. A method for producing an electronic device, comprising:
    forming a resist film on a processing surface using a resist composition;
    irradiating the resist film with exposure light in accordance with immersion lithography;
    developing the exposed resist film so as to form a resist pattern; and
    etching the surface using the resist pattern as a mask so as to form a pattern,
    wherein the resist composition comprises:
    a silicon compound; and
    a resin having an alkali-soluble group which may be substituted with an acid labile group, and
    wherein the silicon compound is expressed by Structural Formula 8:

Structural Formula 8

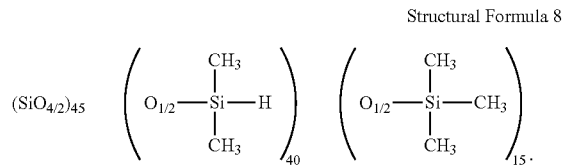

12. The method for producing an electronic device according to claim 11, wherein the processing surface is a surface of an interlayer insulating film having dielectric constant of 2.7 or less.

13. The method for producing an electronic device according to claim 12, wherein the interlayer insulating film is a porous silicon film or a fluororesin film.

* * * * *